United States Patent [19]

Koppensteiner

[11] 4,452,359
[45] Jun. 5, 1984

[54] PRINTED WIRING CARD STIFFENER BRACKET

[75] Inventor: James V. Koppensteiner, Chicago, Ill.

[73] Assignee: GTE Automatic Electric Labs Inc., Northlake, Ill.

[21] Appl. No.: 328,300

[22] Filed: Dec. 7, 1981

[51] Int. Cl.³ .............................................. H02B 1/02
[52] U.S. Cl. ....................................... 211/41; 361/399
[58] Field of Search .................. 211/41; 361/395, 399; 248/466; 174/138 G

[56] References Cited

U.S. PATENT DOCUMENTS

| | | | |
|---|---|---|---|
| 3,668,476 | 6/1972 | Wrakel et al. | 361/395 |
| 3,851,222 | 11/1974 | Michalak et al. | 361/399 |
| 4,388,672 | 6/1983 | Skill | 361/395 X |

FOREIGN PATENT DOCUMENTS

| | | | |
|---|---|---|---|
| 1195829 | 7/1965 | Fed. Rep. of Germany | 361/399 |
| 377902 | 7/1964 | Switzerland . | |

Primary Examiner—Ramon S. Britts
Assistant Examiner—Robert W. Gibson, Jr.
Attorney, Agent, or Firm—Anthony Miologos; Robert J. Black

[57] ABSTRACT

A printed wiring card stiffener bracket comprised of a single piece frame and having slotted tab and fastener arrangements for securing the stiffener bracket to the printed wiring card. The stiffener bracket includes blade arms which bear against the printed wiring card preventing distortion and warpage of the card and assisting in the insertion of the card in a card file. A cover interlockingly engages tabs on the stiffener bracket providing protection to the underlying components and added rigidity to the stiffener bracket.

4 Claims, 3 Drawing Figures

PRINTED WIRING CARD STIFFENER BRACKET

BACKGROUND OF THE INVENTION

(1) Field of the Invention

The present invention relates generally to the field of supporting and strengthening printed circuit boards and more particularly to a new and novel printed wiring card stiffener bracket.

(2) Description of the Prior Art

Large dimensioned printed wiring cards are subject to warpage and linear distortion once they are equipped with fairly heavy components and automatically soldered. Such distortion and warpage makes it difficult but not impossible to insert the card into a card file and also to mate properly with a respective connector. To avoid such linear distortion and warpage and also to assist in the insertion of the card, a stiffener frame or bracket is necessary.

Many support structures of the prior art such as U.S. Pat. No. 3,216,580 which issued to F. V. Fricker, Jr., on Nov. 9, 1965, U.S. Pat. No. 3,539,879 which issued to A. W. Bradley, et.al. on Nov. 10, 1970, and Swiss Pat. No. 377,902 utilize grooved wrap around frames. Such arrangements are normally unsuitable since these support structures either form a portion of the connector or the card file support frame and either interefere with the use of the printed wiring card and normal card file structures or do not provide adequate support due to the tolerances required to allow sliding of a card.

Another structure of the prior art disclosed in German Pat. No. 1,195,829 utilizes a frame type stiffener which supports the entire perimeter of the printed wiring card having engaging tabs which fit through the printed wiring card which are bent over on the opposite side of the card. Such an arrangement is normally unsuitable do to the excessive land areas required by the stiffener frame and the inconsistencies inherent in bending tabs to provide support.

The prior art stiffener bracket assembly discloses in U.S. Pat. No. 3,851,222, requires the modification of the printed wiring card by the addition of slots along the edges to engage tabs on the stiffener frame. This type of modification to the printed wiring card cannot be accomplished in the field.

Accordingly it is a principle object of the present invention to provide a printed wiring card stiffener bracket which may be utilized with standard card files and connector arrangements and with a minimum modification to the wiring card to prevent card distortion and for assisting in the insertion of the card in a card file.

SUMMARY OF THE INVENTION

The objective of the present invention is achieved by providing a printed wiring card stiffener bracket which is comprised of a single piece stiffener frame corresponding to the dimensions of the printed wiring card to be supported. A first portion of the stiffener bracket is normally mounted on the circuit card edge which faces outward of the card file assembly. The remaining or second portion of the stiffener bracket includes blade arms which extend downward from the stiffener and rest on the surface near the edges of the circuit card which are adjacent the first portion edge. The blade arms bear against the card and straighten the card if it is bowed. It has been our experience that wiring cards are normally bowed in the direction toward the solder side of the card. The stiffener bracket mounting is completed by a pair of corner members each including U-shaped slots on their ends which are arranged to accept within the slots the printed wiring card edge opposite the handle.

Finally, the stiffener bracket includes a cover which is arranged to interlockingly engage tabs on the top surface along the periphery of the stiffener bracket. The cover adds increased protection to the components on the card and added rigidity to the stiffener bracket.

Other objects will appear from time to time in the assumed specification, drawings, and claims.

BRIEF DESCRIPTION OF THE DRAWINGS

A better understanding of the invention may be had from the consideration of the following detailed description taken in conjunction with the accompanying drawings in which.

DESCRIPTION OF THE PREFERRED EMBODIMENT

Figure 1:
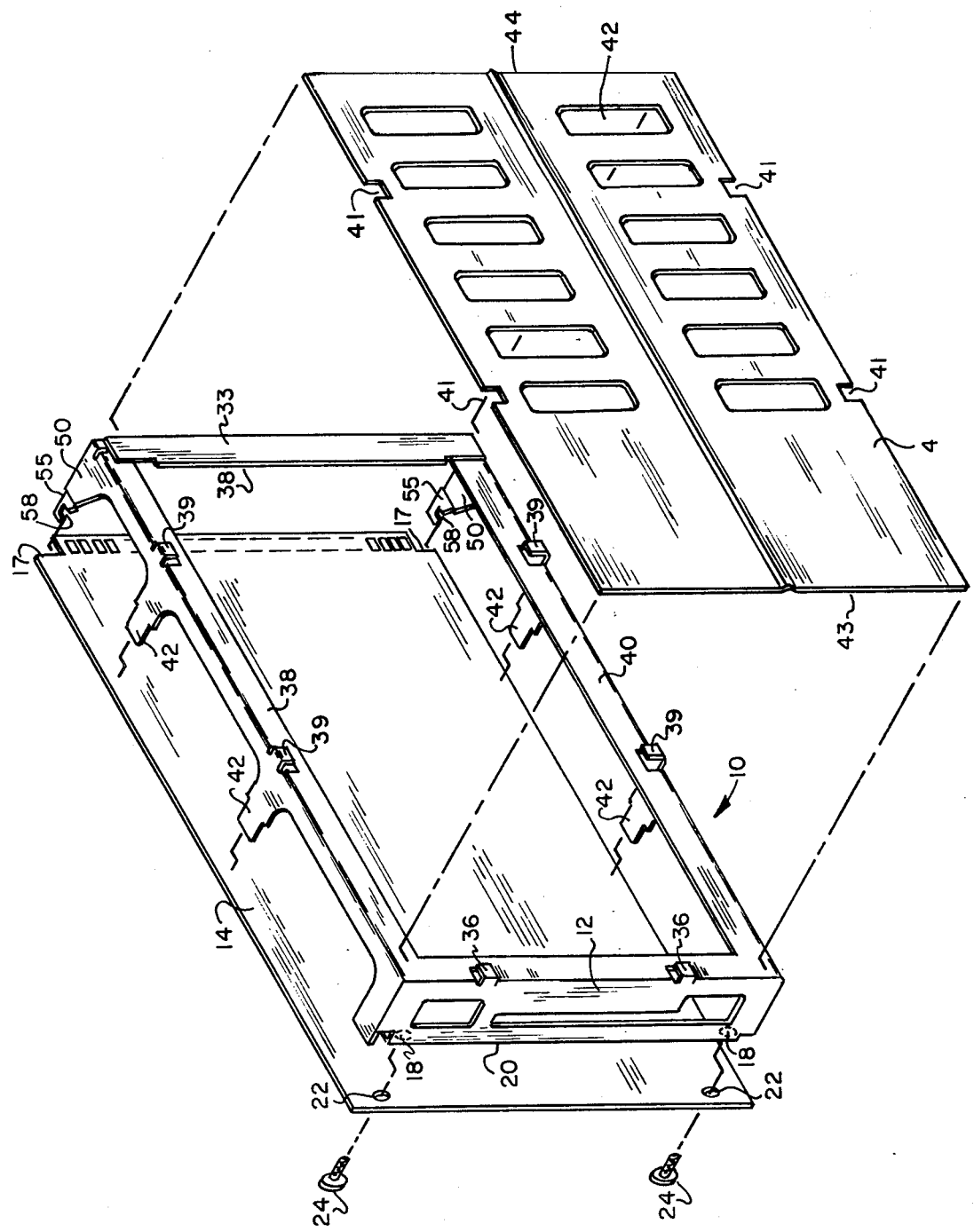
FIG. 1 is a perspective view of the printed wiring card stiffener bracket of the present invention in position to be attached to the printed wiring card.
Figure 2:
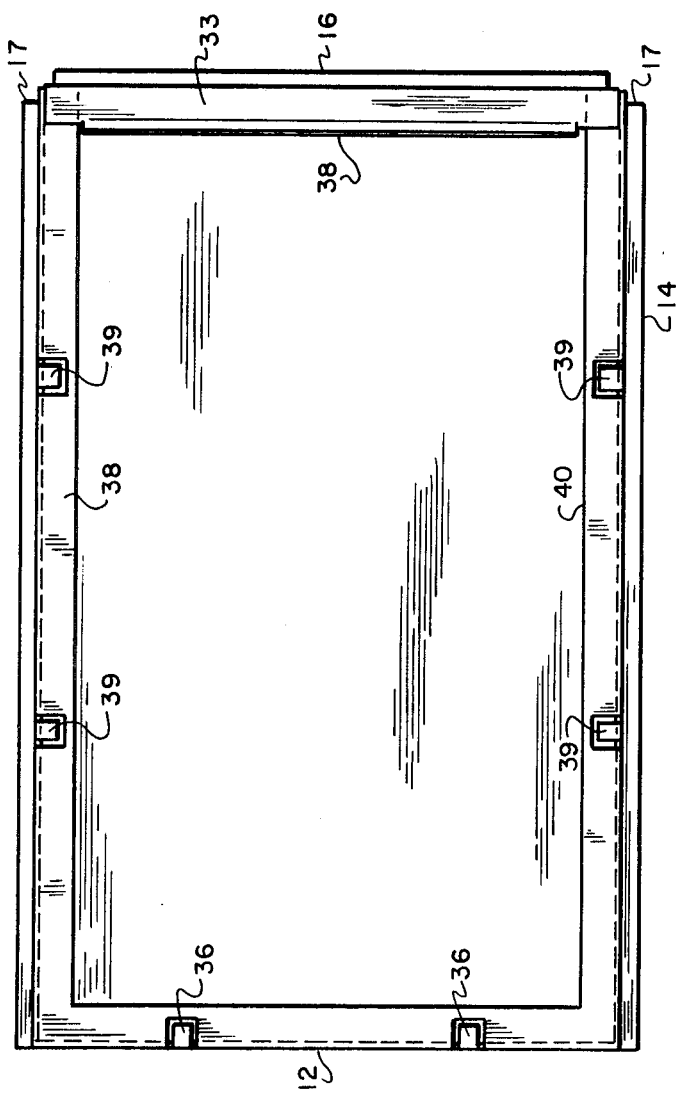
FIG. 2 is a top elevation of the printed wiring card stiffener bracket installed on a printed circuit card and having the top cover removed.
Figure 3:
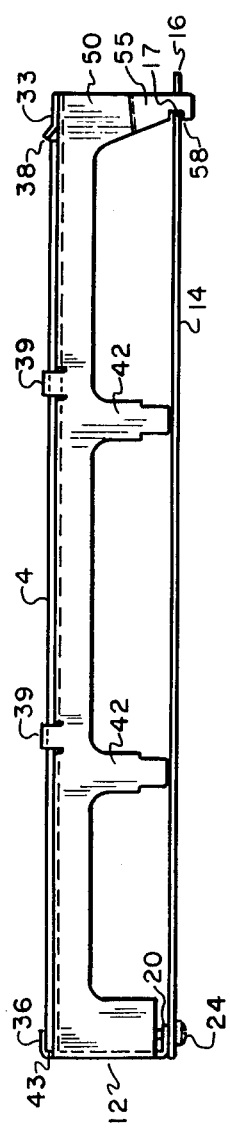
FIG. 3 is a side elevation of the printed wiring card stiffener bracket installed on a printed wiring card with the cover installed.

The printed wiring card stiffener bracket illustrated in FIGS. 1, 2, and 3 is comprised of a single piece frame 10 corresponding to the dimensions of the printed wiring card to be supported. Frame 10 includes a first portion 12 which is approximately the width of the printed circuit card 14. A pair of holes 18 are located along a bottom ledge 20 of the first portion 12. Holes 18 are in alignment with a similar number of holes 22 on the printed wiring card 14. Threaded fasteners 24 or other suitable connecting devices are inserted through aligned holes 18 and 22 of ledge 20 with the fasteners securing frame 10 to the printed wiring card 14, as will be explained in detail hereinafter.

Frame 10 further includes a second section comprised of members 38 and 40 which are in alignment with the edges of the printed wiring card 14. At intervals along sections 38 and 40 for example, every 5 inches along a 13 inch printed wiring card, blade arms 42 are provided which are adapted to rest on the surface of printed wiring card 14. The ends of arms 42 may further include a boot made out of insulating material in order to isolate the stiffener bracket from the printed wiring card. Finally the second portion includes corner members 50 each including inwardly bent tabs 55 and circuit board accepting slots 58. Each slot 58 is arranged to accept a respective outboard edge portion 17 of edge 16 therein. As can be seen in FIG. 1 first portion and a second portion of frame 30 further include L-shaped tabs 36 and 39 respectively which are raised to a distance above their respective frame portions. Tabs 36 and 39 are arranged to accept and hold fast the cover 4 on frame 10.

The printed wiring card stiffener bracket 10 may be formed from aluminum or other suitable metal having the desired characteristics of tensil strength and rigidity. While the present embodiment describes a bracket having blade arms 42 and perimeter frame 10 formed of a integral strip of material it should be noted that various other fabrication techniques may be also suitable. To assemble the stiffener bracket and printed wiring card 14, the stiffener frame 10 is attached to the printed wiring card 14 by first engaging respective outboard edge portion 17 into slots 58 of members 50 allowing blade arms 42 to rest on the printed wiring card 14 as can be seen on FIG. 2. With edge portions 17 firmly seated in respective slots 58 holes 18 are aligned to holes 22 and secured via fasteners 24. It should be noted that holes 22 are usually found on a printed wiring card and are the means for attaching a printed wiring handle to the card.

Cover 4 is installed by first placing the cover over frame 10 with cover slots 41 in registration with tabs 39. Cover 40 is then slid forward allowing edge 43 to be accepted by tabs 36. Tabs 39 also accept and keep an associated edge portion of cover 40 therein. A rear transverse member 33 of frame 10 includes a raised lip 38 which locks the cover 4 in position by acting as a block against edge 44. A plurality of ventilation openings 41 are included to help in air circulation to provide cooling air to the components underneath.

The printed wiring card stiffener bracket of the present invention provides support and rigidity to printed wiring cards by means of blade arms that rest against the surface edges of the printed wiring card in order to prevent linear distortion and warpage as well as to assist the insertion of the printed wiring card to the card file rack. Normally, when the printed wiring card warps or distorts it normally distorts toward the solder side of the card. Therefore arms 42 straighten the card if warpage occurs. The method of mounting the stiffener bracket to the printed wiring card allows the edges of the printed wiring card to slide into standard card file guides without interference while the flat blade arms result in a minimum loss to card component mounting area. The stiffener bracket mounts to the printed wiring card with a minimum of alteration to the card and in most cases can be installed without any wiring card modification whatsoever. The assembled stiffener bracket and printed wiring card then form an assembly of high strength which allow the handling of the assembly without strain to either part of the bracket or card.

The present invention has been described with reference to a specific embodiment thereof, for the purpose of illustrating the manner in which the invention may be used to advantage. It would be appreciated by those skilled in the art that the invention is not limited thereto. Accordingly any and all modifications or variations, or equivalent arrangements which may occur to those skilled in the art should be considered to be within the scope of the invention.

What is claimed is:

1. A printed wiring card stiffener bracket comprising:
   a first portion extending along the edge of a printed wiring card to be stiffened that is exposed when the card is inserted into a card file, said first portion including means mounting said first portion to the printed wiring card; and,
   a second portion integrally joined to said first portion, extending along the remaining edges of the printed wiring card and including a plurality of blade arms resting on the edges of the printed wiring card that adjoin the second portion at intervals suitable to stiffen the printed wiring card and prevent warpage and linear distortion, and a pair of corner members each including L-shaped tab portions having a slot opening toward said first portion and arranged to engage and accept therein the printed wiring card edge opposite said first portion, whereby said stiffener bracket is retained to said printed wiring card.

2. The printed wiring card stiffener bracket as recited in claim 1, wherein: said first and second portions include a top surface oriented parallel to said printed wiring card and said first portion top surface includes at least one L-shaped tab raised above said first portion top surface forming a cover receiving area thereat, said said second portion top surface also including a plurality of L-shaped tabs raised above the second portion each tab forming a respective cover receiving area.

3. The printed wiring card stiffener bracket as recited in claim 2, wherein: there is included a generally rectangular stiffener bracket cover having a plurality of transverse notches on its edges corresponding to said plurality of second portion L-shaped tabs, whereby said cover is mounted to said stiffener bracket by resting said cover on said second portion top surface with each of said cover notches in registration with a respective one of said plurality of second portion tabs and manually moving said cover forward thereby engaging a portion of said cover with said first portion cover receiving area and simultaneously each of said second portion cover receiving areas accepting an associated portion of said cover therein, thereby retaining said cover to said stiffener bracket.

4. A printed wiring card stiffener bracket as recited in claim 1, wherein: the printed wiring card edge where said first portion is mounted includes at least a pair of apertures and said first portion includes a pair of apertures in alignment with said printed wiring card apertures, whereby said first portion mounting means are at least a pair of threaded fasteners each arranged to be accepted within a different one of said pair of aligned apertures, mounting said first portion to said card.

* * * * *